United States Patent [19]

Fujita et al.

[11] Patent Number: 5,084,413
[45] Date of Patent: Jan. 28, 1992

[54] METHOD FOR FILLING CONTACT HOLE

[75] Inventors: Tsutomu Fujita, Hirakata; Takao Kakiuchi, Takarazuka; Hiroshi Yamamoto, Neyagawa; Shoichi Tanimura, Hirakata, all of Japan

[73] Assignee: Matsushita Electric Industrial Co., Ltd., Osaka, Japan

[21] Appl. No.: 532,170

[22] Filed: May 29, 1990

Related U.S. Application Data

[63] Continuation of Ser. No. 233,831, Aug. 18, 1988, abandoned, which is a continuation of Ser. No. 32,586, Apr. 1, 1987, abandoned.

[30] Foreign Application Priority Data

| Apr. 15, 1986 | [JP] | Japan | 61-86440 |
| Apr. 15, 1986 | [JP] | Japan | 61-86441 |
| Jun. 18, 1986 | [JP] | Japan | 61-141919 |
| Aug. 8, 1986 | [JP] | Japan | 61-187121 |

[51] Int. Cl.$^5$ .................................. H01L 21/285
[52] U.S. Cl. ................................ 437/189; 437/192; 437/193; 437/196; 437/200; 437/203; 437/229
[58] Field of Search ............ 148/DIG. 30, 19, 78, 148/83, 147; 156/656, 657; 357/67, 71; 437/67, 189, 192, 193, 196, 200, 203, 229, 245, 246, 948

[56] References Cited

U.S. PATENT DOCUMENTS

| 3,881,242 | 5/1975 | Nuttall et al. ........................ 437/192 |
| 4,107,726 | 8/1978 | Schilling ................................ 357/67 |
| 4,253,888 | 3/1981 | Kikuchi ................................ 437/67 |
| 4,343,676 | 8/1982 | Tarng ................................ 437/228 |
| 4,349,408 | 9/1982 | Tarng et al. ........................ 29/590 |
| 4,403,392 | 9/1983 | Oshima et al. ...................... 437/162 |
| 4,443,930 | 4/1984 | Hwang et al. ...................... 29/591 |
| 4,473,598 | 9/1984 | Ephrath et al. ...................... 437/67 |
| 4,481,706 | 11/1984 | Roche ................................ 437/162 |
| 4,540,607 | 9/1985 | Tsao ................................ 427/39 |
| 4,587,710 | 5/1986 | Tsao ................................ 437/200 |
| 4,589,196 | 5/1986 | Anderson ............................ 29/591 |
| 4,589,928 | 5/1986 | Dalton et al. ........................ 29/591 |
| 4,673,592 | 6/1987 | Porter et al. ........................ 437/203 |
| 4,676,847 | 6/1987 | Lin ................................ 437/67 |
| 4,720,908 | 1/1988 | Wills ................................ 437/203 |

FOREIGN PATENT DOCUMENTS

| 0211318 | 2/1987 | European Pat. Off. ............. 437/203 |
| 0054651 | 3/1983 | Japan ................................ 437/67 |
| 0197851 | 11/1983 | Japan ................................ 437/203 |
| 0205735 | 11/1984 | Japan ................................ 437/67 |
| 0168256 | 7/1986 | Japan ................................ 437/203 |
| 0214449 | 9/1986 | Japan ................................ 437/203 |

OTHER PUBLICATIONS

Saraswat et al., "Selective CVD of Tungsten for VLSI Technology", VLSI Science & Technology, Proceedings, vol. 84, 1984, pp. 409-419.
Brors et al., "Properties of Low Pressure CVD Tungsten Silicide . . . ", Solid State Technology; Apr. 1983, pp. 183-186.
Ghandhi, "VLSI Fabrication Principles," John Wiley & Sons, New York, NY, 1983, pp. 435-439.
Smith, "CVD Tungsten Contact Plugs by In Situ Deposition and Etchback", V-MIC Conf., 1985, pp. 350-356.
Stacy et al., "Interfacial . . . Tungsten Layers Formed by Selective Low Pressure Chemical Vapor Deposition," J. Electrochem. Soc., vol. 132, No. 2, Feb. 1985, pp. 444-447.
Broadbent et al., "Selective Low Pressure Chemical Vapor Deposition of Tungsten," J. Electrochem. Soc., vol. 131, No. 6, Jun. 1984, pp. 1427-1433.

Primary Examiner—Olik Chaudhuri
Assistant Examiner—M. Wilczewski
Attorney, Agent, or Firm—Wenderoth, Lind & Ponack

[57] ABSTRACT

A method for filling a contact hole in which (i) a silicon dioxide layer is formed on a silicon substrate; (ii) a contact hole is formed in the silicon dioxide layer; (iii) polysilicon film is formed on the side and bottom surface portions of the contact hole; (iv) gas containing tungsten reacts with the film; and (v) the contact hole is filled up with tungsten.

3 Claims, 11 Drawing Sheets

METHOD FOR FILLING CONTACT HOLE

This application is a continuation of now abandoned application, Ser. No. 07,233,831 filed on Aug. 18, 1988 which is a continuation of Ser. No. 07,032,586 filed on Apr. 1, 1987 now abandoned.

BACKGROUND OF THE INVENTION

This invention relates to a method for filling a contact hole, and more particularly to a method for filling a contact hole with a metal such as selective CVD-tungsten (W).

In the past, in case where an electrode is formed on an inner side surface of a contact hole which is formed in an insulation layer, a metal such as aluminum (Al) etc. is used as material for the electrode and, sputtering method is used for deposition of the metal on inner side surface of the contact hole. However, where the diameter of the contact hole becomes less than one (1) μm, i.e., submicron, it becomes impossible to coat aluminum on the inner side surface of the contact hole by use of a sputtering technique. As a result, aluminum wiring is broken or reliability as to electromigration resistance etc. decreases.

To prevent the occurrence of such problems, a certain technology was proposed (see, Journal of Electrochemical Society, SOLID-STATE SCIENCE AND TECHNOLOGY, "Selective LPCVD Tungsten for Contact Barrier Applications" Levy et al., September 1986, Vol. 133, No. 9, pages 1905-1912, and "Structure of Selective Low Pressure Chemically Vapor-Deposited Films of Tungsten" Green et al., May 1985, Vol. 132, No. 5). The technology relates to selectively filling contact holes with LPCVD tungsten. In this technology, an oxide film is formed on a silicon substrate as a semiconductor substrate, and a contact hole is formed in the oxide film. Then, tungsten (W) as metal is selectively grown in the contact hole.

This technology has, however, some drawbacks. That is, it may occur that tungsten encroaches up to a diffusion layer or in the vertical direction through the diffusion layer due to stress of the oxide film at periphery of bottom surface portion of contact hole so that the junction of the diffusion layer and semiconductor substrate may be broken down.

Further, it may also that tungsten is also deposited on the surface of the oxide film so that tungsten is grown thereon. As a result, it becomes impossible to fill up only the contact hole with tungsten. By use of this technology, maximum thickness of selective growth is approximately 2000~3000 Å (i.e., 0.2~0.3 μm) so that it is impossible to completely fill the contact hole whose depth is 0.5~1 μm. Therefore, it may occur that junctions are broken down, wiring is broken and reliability decreases.

SUMMARY OF THE INVENTION

The present invention, therefore, has as its principal object the provision of an improved method for filling a contact hole in which a contact hole is completely filled with metal so that problems of junction breakdown, wiring breakdown and low reliablity can be solved.

This and other objects are accomplished by a method for filling a contact hole which comprises forming an insulation layer on a semiconductor substrate, forming a contact hole in the insulation layer, forming a film containing one of semiconductive material and first metal on the side and bottom surface portions of the contact hole, and reacting a gas containing second metal with the film so that the second metal is selectively grown in the contact hole and the contact hole is filled up with the second metal. The second metal may be tungsten. The film of semiconductive material may be made by polysilicon or amorphous silicon. Impurity may be doped in the polysilicon or amorphous silicon film. The first metal may be W, Mo, $WSi_2$, $TiSi_2$, Ti etc.

While the novel features of the invention are set forth with particularly in the appended claims, the invention, both as to organization and content, will be better understood and appreciated, along with other objects and features thereof, from the following detailed description taken in conjunction with the drawing.

DETAILED DESCRIPTION OF THE INVENTION

Figure 1:
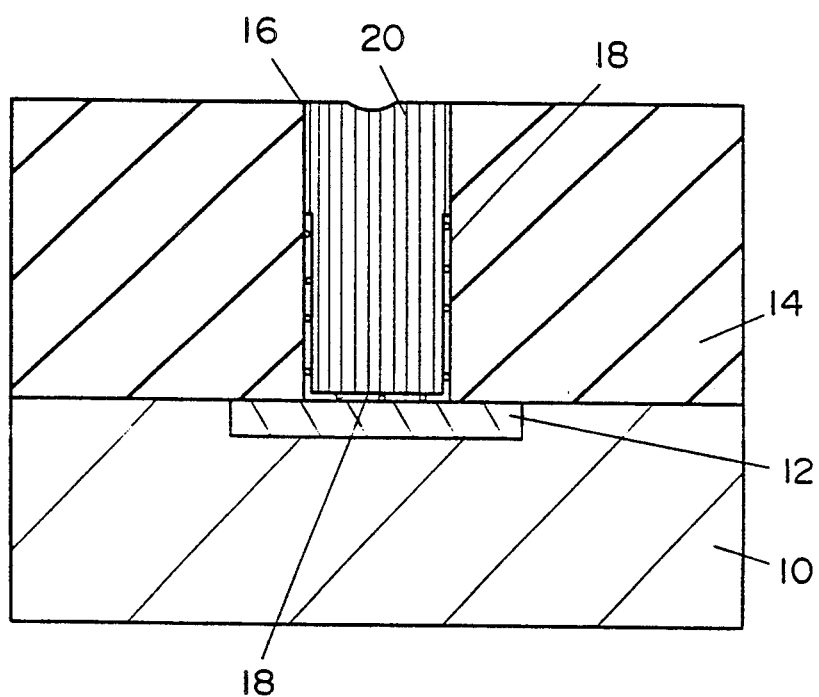
FIG. 1 is a sectional view showing a contact hole portion of a semiconductor device which is fabricated by a first example of a method for filling a contact hole according to the invention.

FIG. 1 shows a structure of a contact hole portion of a semiconductor device which is fabricated by a method of the present invention. A diffusion layer 12, in which silicon is diffused with high concentration, is formed in an upper surface of silicon substrate 10 as a semiconductor substrate. A silicon dioxide ($SiO_2$) layer 14 as an insulation layer is formed on the surface of the silicon substrate 10. The insulation layer 14 has contact hole 16 which penetrate through insulation layer 14, i.e., from a bottom surface to an upper surface of insulation layer 14. A polysilicon film 18 is formed on a lower side surface of hole 16 and at the bottom surface portion of hole 16. The contact hole 16 is filled with tungsten 20 (W) as metal or filling material.

FIGS. 2 through 8 shows a first example of the method of the present invention by which FIG. 1 structure is fabricated.

First, a masking pattern (not shown) is formed on semiconductor substrate 10. By conventional silicon ion-implantation, diffusion layer 12 is formed in the upper surface area of semiconductor substrate 10.

Figure 2:
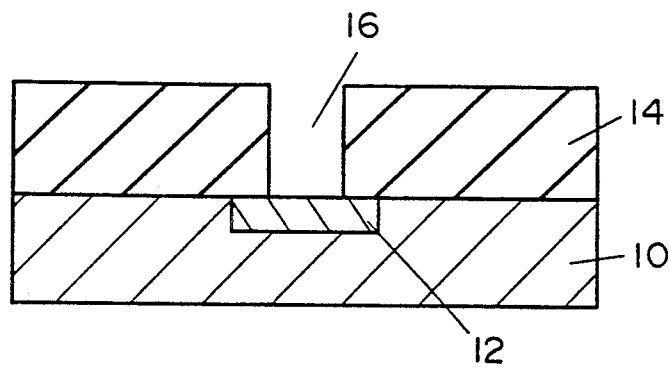
FIGS. 2 through 8 are sectional views for illustrating the first example method.

After the masking pattern is removed, insulation layer 14 is formed on semiconductor substrate 10. Another masking pattern (not shown) is formed on insulation layer 14. By the conventional etching method, contact hole 16 is formed in insulation layer 14 so that a part of the upper surface of diffusion layer 12 is exposed to the outside through contact hole 16 as shown in FIG. 2.

Figure 3:
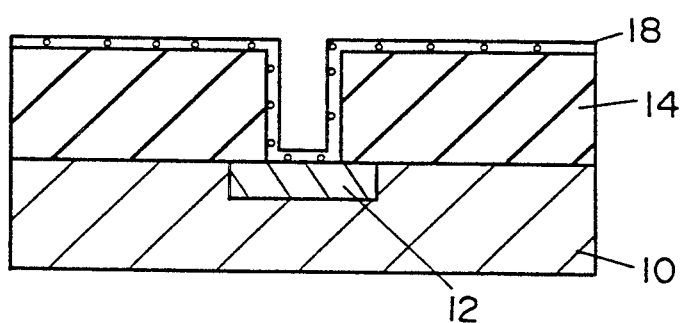

In FIG. 3, polysilicon film 18 is deposited on the entire surface of insulation layer 14, in other words, the upper surface of the layer 14, and entire inner side surface of contact hole 16 and a part of the upper surface of diffusion layer 12 which is exposed in contact hole 16. The thickness of film 18 deposited is 100 Å~1000 Å (i.e., 0.01~0.1 μm). The deposition is carried out by conventional chemical vapor deposition (CVD) method, sputtering method etc. In case that the sputtering method is used for the deposition, silicon in the film 18 assumes an amorphous-like state. In this case, a film containing metal (e.g., $WSi_2$, W, Mo, $MoSi_2$) may be deposited instead of the polysilicon film 18. In case that CVD method is used, the film 18 is sufficiently grown on the inner side surface of contact hole 16 since CVD method is good in step coverage.

Figure 4:
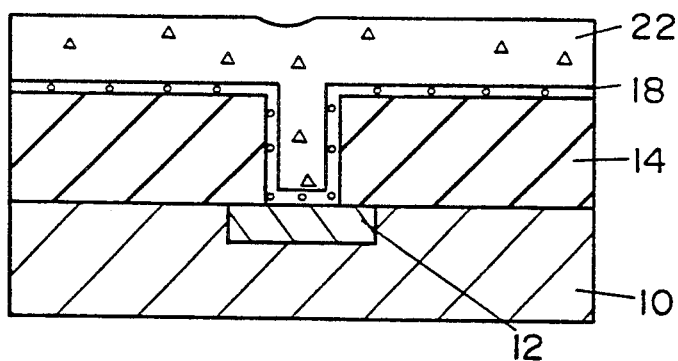

In FIG. 4, an entire upper surface of polysilicon film 18 is coated with resist layer 22 so that the surface of film 18 is planarized. Since the resist is of liquid, contact hole 16 is completely filled up with the resist 22.

Figure 5:
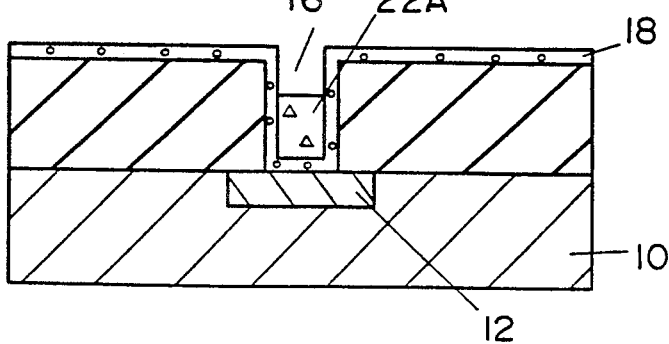

In FIG. 5, the resist layer 22 is removed by conventional dry etching method except the resist 22A located in contact hole 16. The thickness or depth of the resist 22A which is left in contact hole 16 is controlled by etching time, or period. Since a part of the resist layer 22 located at contact hole 16 is thicker than the remainder of resist layer 22 as shown in FIG. 4, a part of resist 22A is left in contact hole 16 after the resist layer 22 is completely removed from the upper surface of insulation layer 14. Instead of resist 22, other material such as polyimide may be used, which material can fill up the contact hole 16 and be removed by etching without thin film 18 and insulation layer 14 being removed by the etching.

Figure 6:
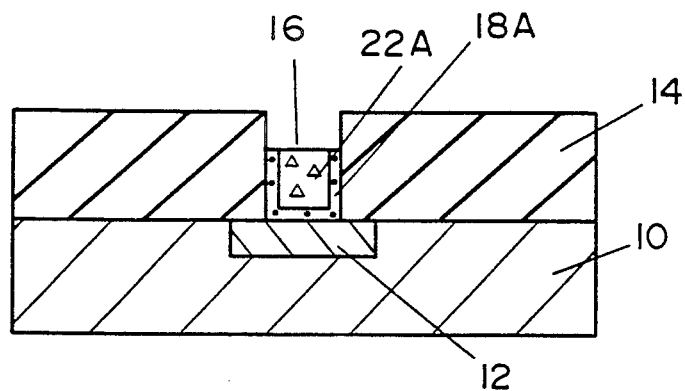

In FIG. 6, polysilicon film 18 is removed by the conventional etching technique with the use of resist 22A as a mask. Thereby, polysilicon film 18A is left at the side and bottom surface portions of contact hole 16.

Figure 7:
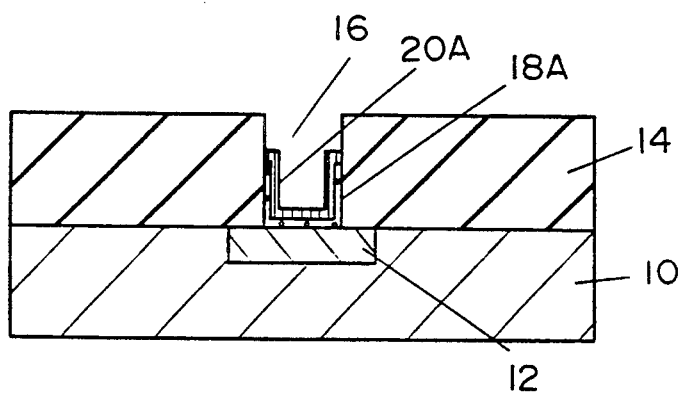

In FIG. 7, resist 22A is removed and then, tungsten film 20A is deposited on the inner surface of polysilicon film 18A. The deposition is carried out by the following. That is, polysilicon film 18 is reacted with gas which is produced by diluting tungsten hexafluoride ($WF_6$) with argon (Ar). Thereby, tungsten film 20A is deposited on polysilicon film 18A and its circumference.

In other words, tungsten is selectively grown only on the side and bottom surface portions of contact hole 16 by use of the silicon reduction reaction:

$2WF_6 + 3Si \rightarrow 2W + 3SiF_4$. In this reaction, $WF_6$ mainly reacts with polysilicon film 18A and almost never reacts with diffusion layer 12 of monocrystalline silicon which exists in semiconductor substrate 10. Therefore, following two phenomena do not occur: (i) phenomenon wherein $WF_6$ reacts with diffusion layer 12 and tungsten encroaches into area between diffusion layer 12 and silicon oxide layer 14; and (ii) phenomenon wherein $WF_6$ reacts with diffusion layer 12 and tungsten moves in the direction perpendicular to diffusion layer 12 so that the junction is broken. In the above-explained reaction, if such reaction is carried out under the condition that polysilicon is completely consumed, contact resistance decreases.

Figure 8:
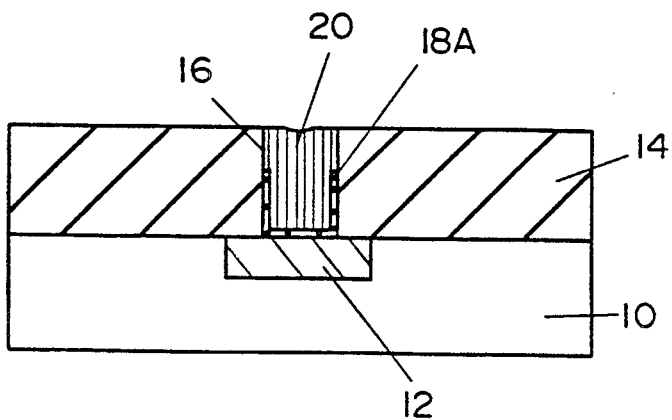

In FIG. 8, $WF_6$ reacts with gas which contains hydrogen ($H_2$); $WF_6 + 3H_3 \rightarrow W + 6HF$. By use of such reaction of hydrogen reduction, tungsten is grown. At this time, since hydrogen is adsorbed only on a surface of metal and thereby, ionized, the growth of tungsten occurs only on the side and bottom surface portions of contact hole 16, and does not occur on the upper surface of insulation layer 14. Further, since additional deposition by use of reaction from the side surface of contact hole 16 is conducted, contact hole 16 can be filled up with tungsten for a short time period. For example, in the case of a contact hole with an aspect ratio of 1, time for the filling up becomes half of the ordinary case. The finer the contact hole is, the shorter the growth time becomes.

If the growth time becomes shorter, the by-product of the reaction does not become fixed on silicon oxide layer 14, and tungsten is not deposited around a nucleus which initially exists on silicon oxide layer 14. Therefore, selectivity is maintained so that contact hole 16 is completely filled with tungsten 24.

Further, since, in the above example, thickness or height of polysilicon film 18A, which is formed on the side surface of contact hole 16, can be controlled, an upper surface of tungsten layer 20, which fills contact hole 16, can be planarized well.

After the step of FIG. 8, it is possible to easily form electrodes and wirings by use of conventional sputtering method on tungsten 20.

In the above example at the steps of FIGS. 7 and 8, $WF_6$ is used as the gas containing metal, but other gas such as $MoF_6$, $Mo(CO)_6$, $W(Co)_6$ may be used to deposit $M_0$, W. Further, in the above example, diffusion layer 12 is silicon layer. Even if a film such as $WSi_2$, $TiSi_2$, $MoSi_2$, Mo, Ti etc is disposed on diffusion layer 12, the method of the above embodiment may be applicable.

Figure 9:
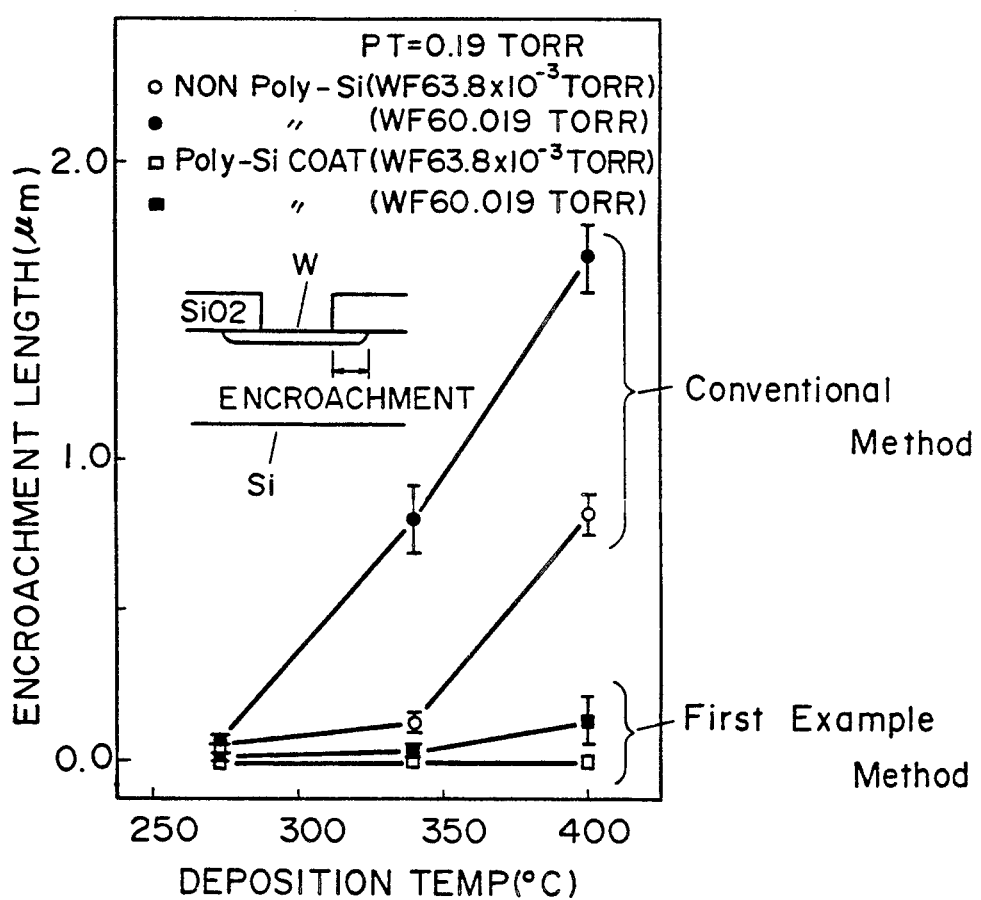
FIG. 9 is a graph showing encroachment length vs. deposition temperature.

FIG. 9 shows the relation between encroachment length of tungsten and deposition temperature. It is apparent from FIG. 9 that encroachement length in the above example is less than that in the conventional method.

Figure 10A:
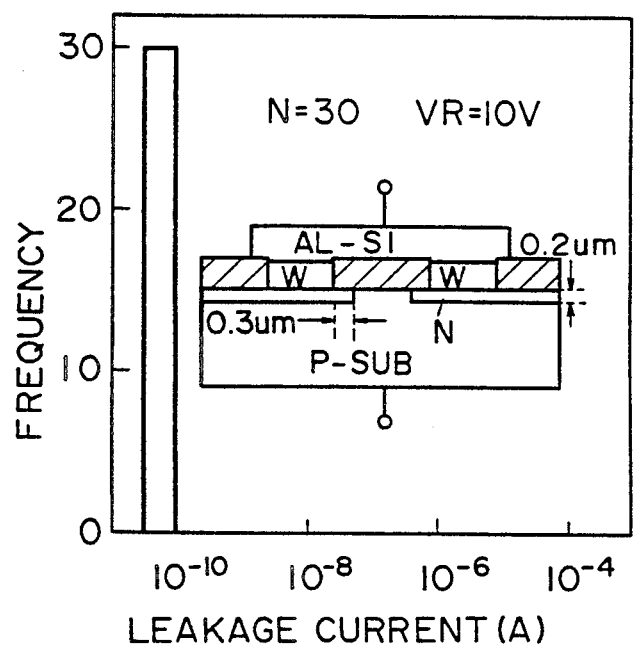
FIGS. 10A and 10B are graphs showing frequency vs. leakage current.
Figure 10B:
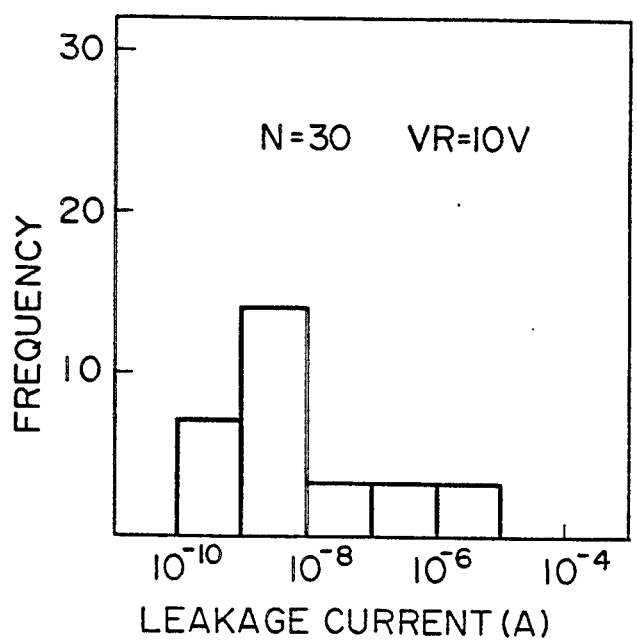

FIGS. 10A and 10B shows leakage current in case that tungsten is formed at silicon contact having shallow junction. FIG. 10A is of the above example method, and FIG. 10B is of the conventional method. It is apparent from the comparison of FIGS. 10A and 10B that leakage current in the above example method is much less than that in the conventional method.

Figure 11:
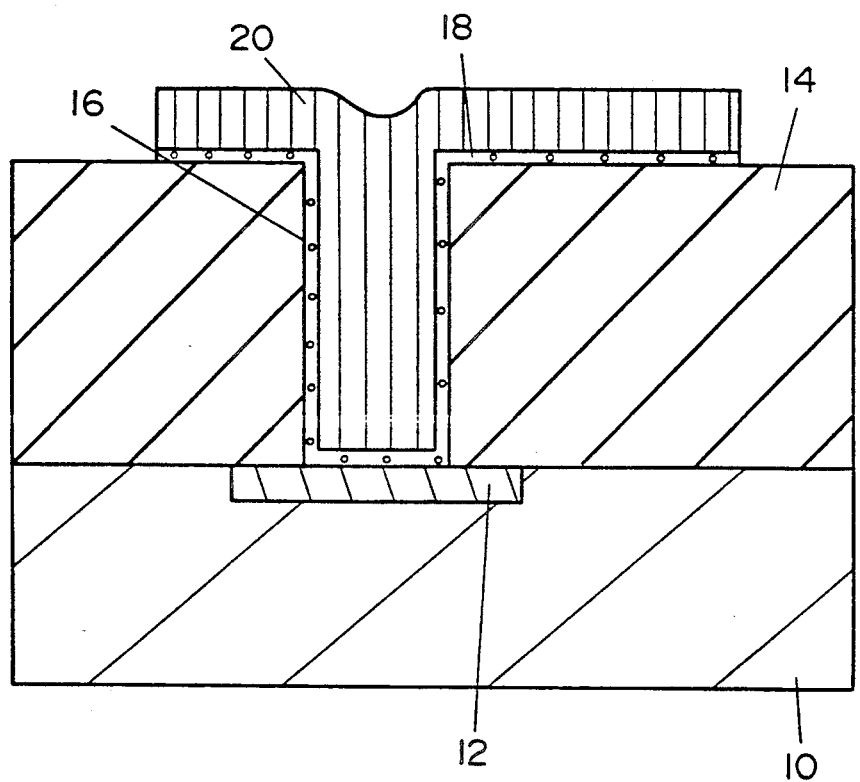
FIG. 11 is a sectional view showing a contact hole portion of a semiconductor device which is fabricated by a second example method.

FIG. 11 shows a contact portion of a semi-conductor device which is fabricated by the second example method. The same numerals are used for the same elements as in the first example shown FIGS. 1~8. In FIG. 11, polysilicon film 18 is left on insulation layer 14 as well as on the side and bottom surface portions of contact hole 16, and tungsten 20 is disposed on polysilicon film 18 at the portion corresponding to the upper surface of insulation layer 14 as well as inside of contact hole 16. In this embodiment, polysilicon film 18 is patterned by use of photolithography technique. The same advantages as the first example may be obtained in the second example.

Figure 12:
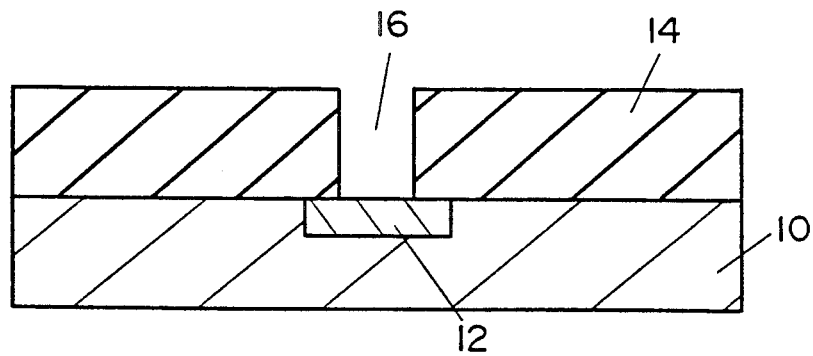
FIGS. 12 through 16 are sectional views for illustrating the second example method.
Figure 13:
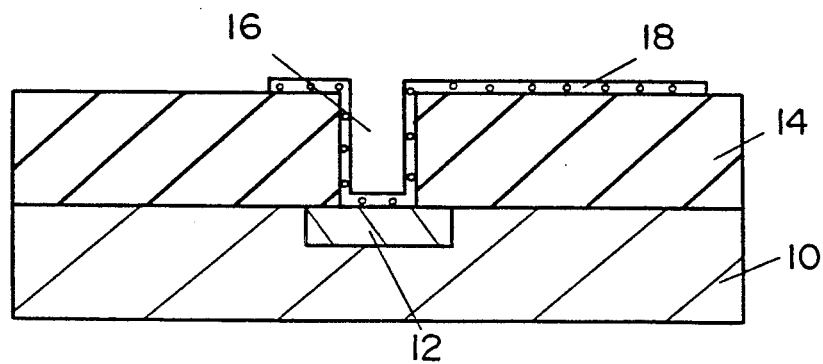
Figure 14:
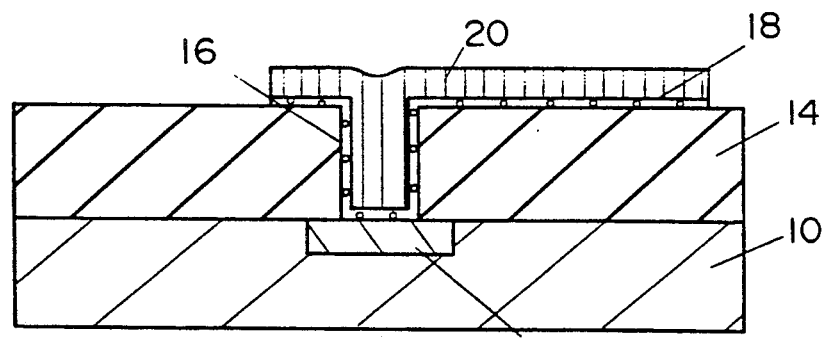

FIGS. 12~14 shows the method of the second example. These processes of FIGS. 12~14 are almost the same as those of FIGS. 2~8. Therefore, detailed explanation is omitted.

Figure 15:
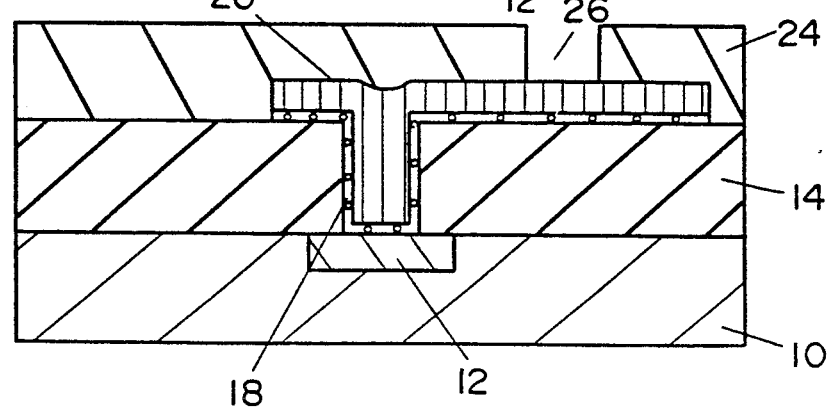

After the step of FIG. 14, in FIG. 15, silicon deoxide layer as insulation layer 24 is formed on insulation layer 14 and tungsten layer 20. Then, contact hole 26 is formed in insulation layer 24.

Figure 16:
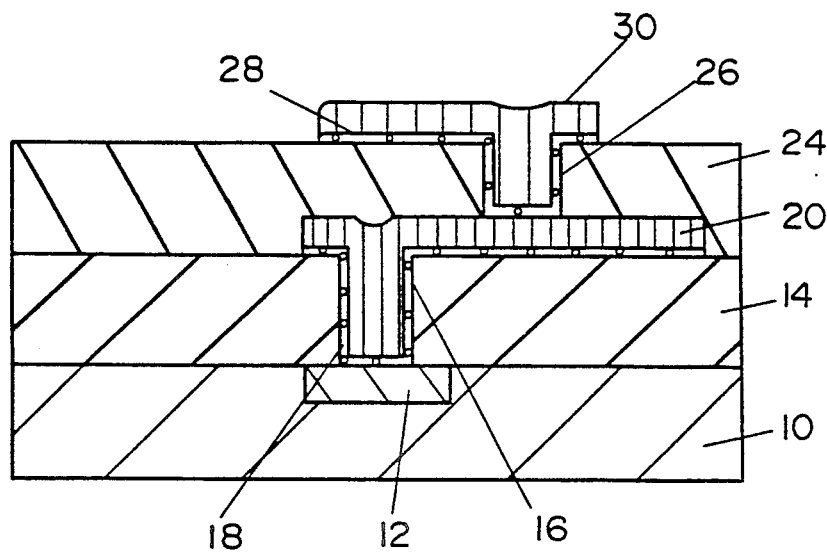

In FIG. 16, polysilicon layer 28 is formed on the upper surface of insulation layer 24 and on the inner side and bottom surface portions of contact hole 26 by the same method as used in forming of polysilicon film 18. Then, contact hole 26 is filled up with tungsten 30 by the same method as used in filling up contact hole 16 with tungsten 20.

The tungsten layers 20 and 30 are used as, for example, wiring layers which electrically connect active devices such as transistors etc.

Figure 17:
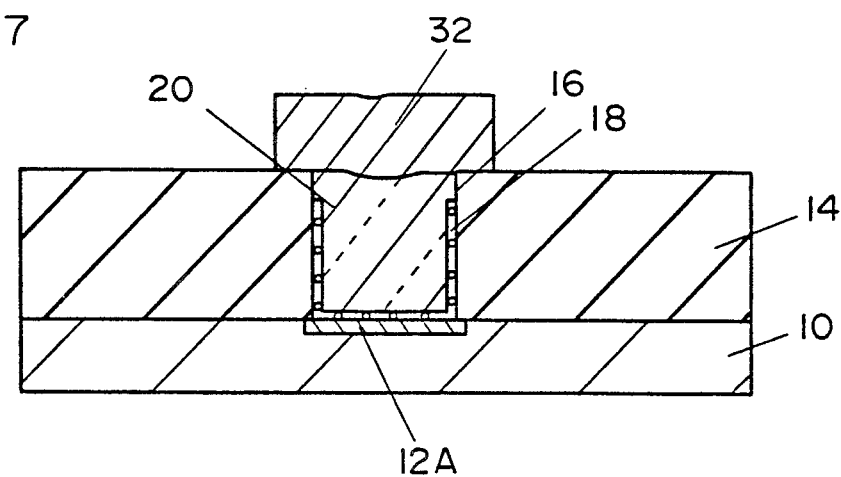
FIG. 17 is a sectional view showing a contact hole portion of a semiconductor device which is fabricated by a third example method.
Figure 18:
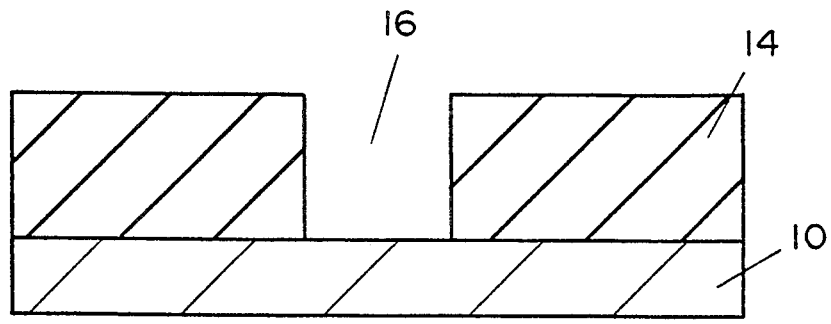
FIGS. 18 through 24 are sectional views for illustrating the third example method.
Figure 19:
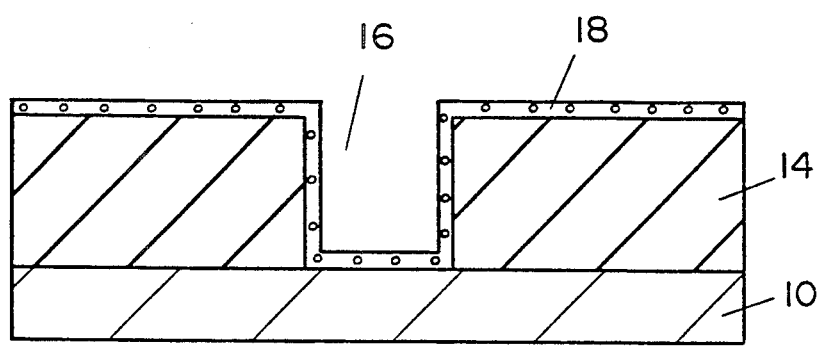

FIGS. 17 shows a contact portion of a semiconductor device which is fabricated by the third example method. Same numerals are used for the same elements as in the first and second examples. In FIG. 17, layer 12A is shallow diffusion layer of approximately 300~1000 Å (i.e., 0.03~0.1μ) thickness so that contact resistance may decrease. 32 designates an electrode for wiring which is formed on tungsten 20. FIGS. 18~24 show the method of the third example. After a silicon deoxide layer as insulation 14 is formed on silicon substrate 10 in FIG. 18, a masking pattern (not shown) is formed on insulation layer 14. By the conventional etching method with the masking pattern, contact hole 16 is formed in insulation layer 14 so that a part of the upper surface of semiconductor substrate 10 is exposed to the outside through contact hole 16. Thereafter, polysilicon film 18 is deposited on the entire surface of silicon oxide layer 14, in other words, the upper surface of the layer 14, an entire inner side surface of contact hole 16 and a part of upper surface of silicon substrate 10 which is exposed in contact hole 16, in the same manner in FIG. 3. FIG. 19 structure is obtained by such process.

Figure 20:
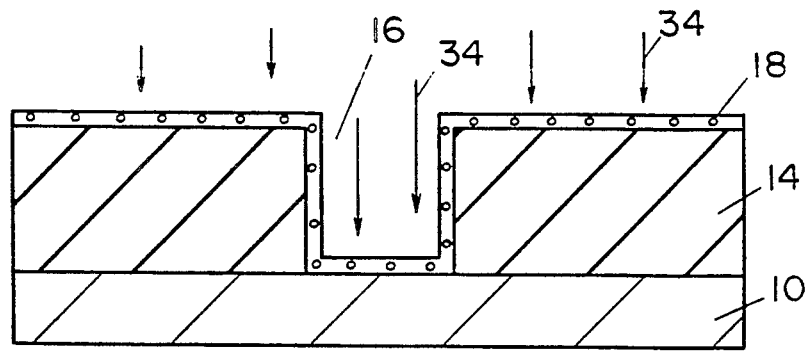

In FIG. 20, an impurity such as arsenic (As), boron (Br) etc. is ion-implanted as shown by arrow 34, and energy of ion-implantation is adjusted in such manner that the peak amount of impurity is located in polysilicon film 18.

Figure 25:
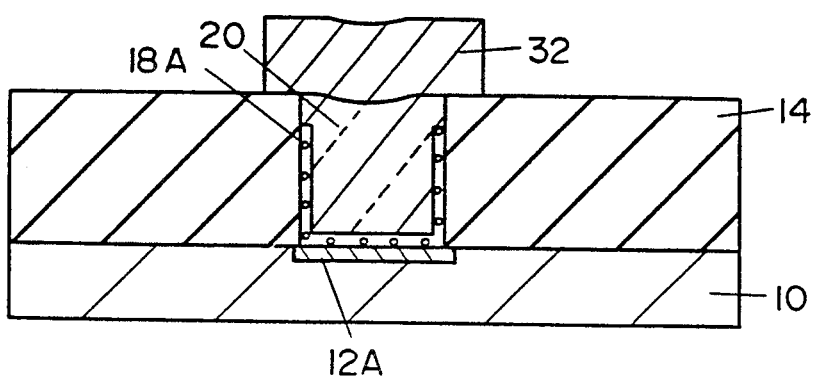
FIGS. 25 through 28 are graphs showing profiles of contact hole portions.

FIG. 25 shows the result of the above-stated ion-implantation, by concentration of arsenic. The vertical line of FIG. 25 shows thickness of polysilicon film 18, monocrystalline semiconductor substrate 10, and the horizontal line shows concentration of arsenic. Since the channeling effect is suppressed in polysilicon film 18, the impurity (arsenic) does not almost enter in semiconductor substrate 10. In case that the impurity is boron, the same effect is obtained.

Figure 21:
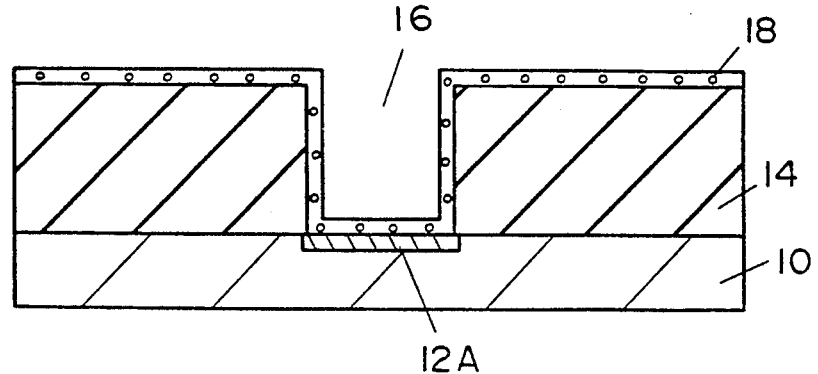

After the ion-implantation, heat treatment is carried out so that arsenic is diffused from polysilicon film 18 into semiconductor substrate 10. Thereby, shallow diffusion layer 12A of approximately 300~1000 Å (i.e., 0.03~0.1 μm) thickness is obtained as shown in FIG. 21. In this case, polysilicon film 18 becomes a diffusion source.

Figure 22:
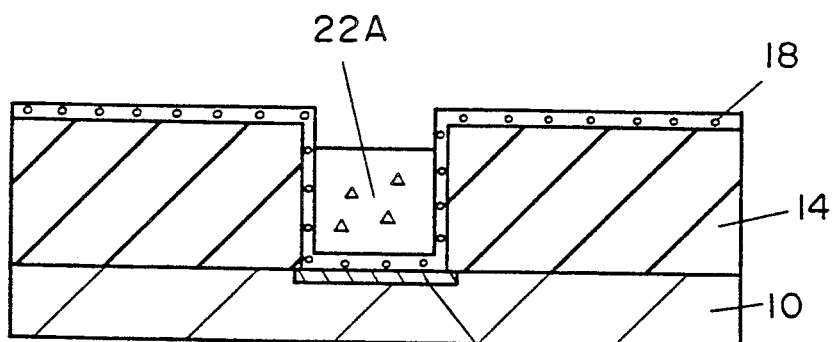
Figure 23:
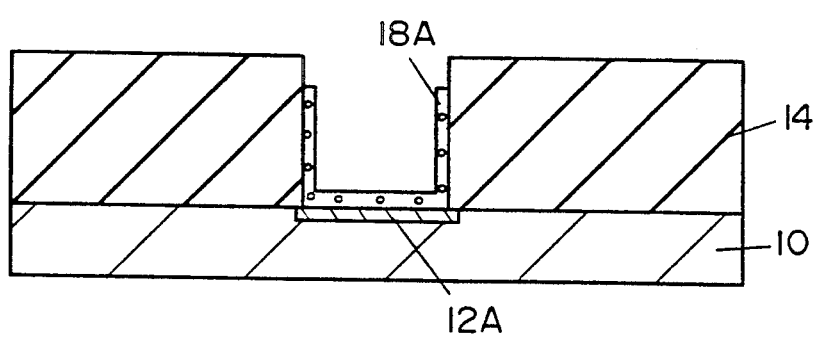
Figure 24:
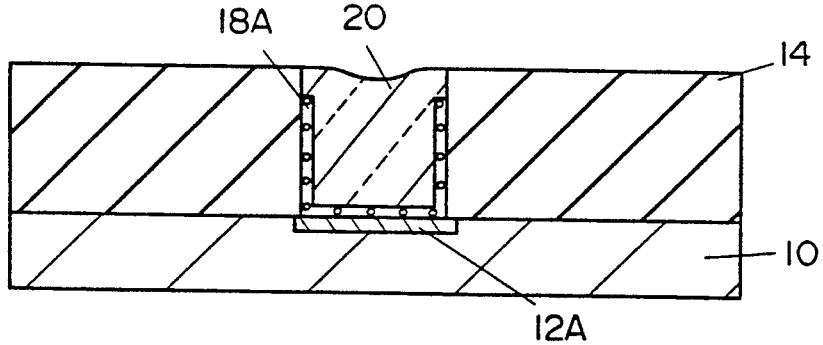

After this step, same steps as in FIGS. 3~8 are conducted as shown in FIGS. 21~23 so that the FIG. 23 structure is obtained. Then, in FIG. 24, electrode 32 is formed on tungsten 20 and its circumference.

In the third example, a shallow diffusion layer 12A is obtained and concentration of impurity in silicon layer, which contacts tungsten 20, is increased so that contact resistance may be considerably decreased.

Figure 26:
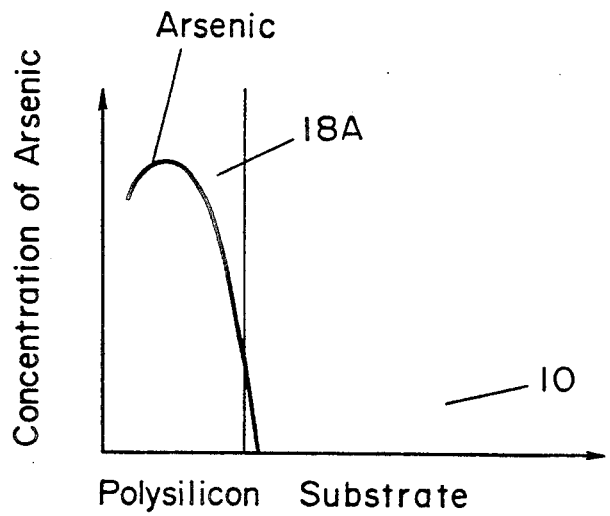
Figure 27:
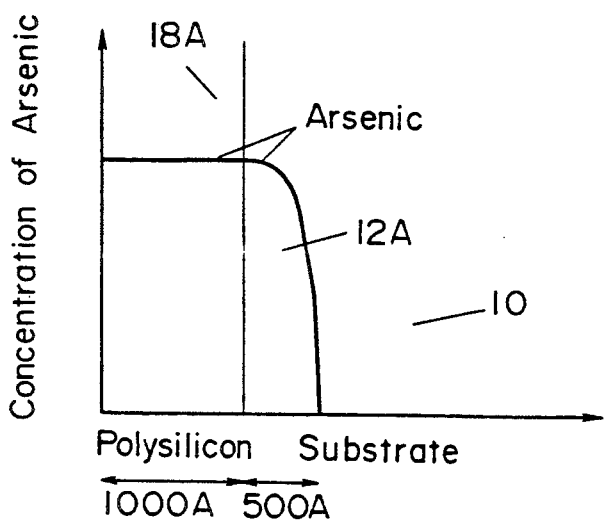
Figure 28:
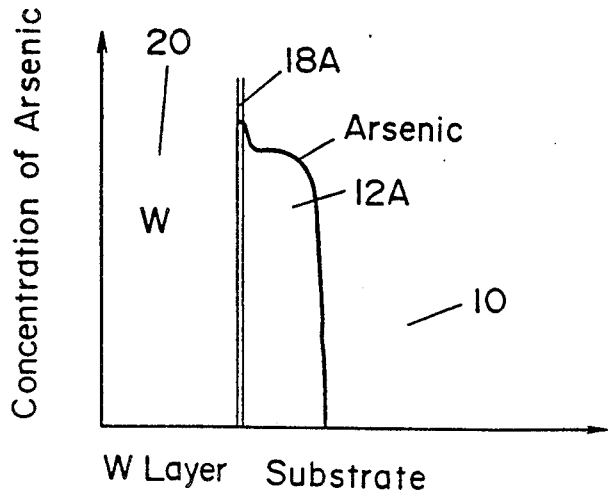

FIGS. 26 shows the concentration of arsenic in FIG. 22 and FIG. 27 shows a profile of tungsten (W) and impurity.

In the above third example, the ion-implantation technique is used to introduce impurity into polysilicon film 18, but other method is applicable. That is, impurity is previously doped into polysilicon and the polysilicon is directly deposited on the contact hole portion. In this case, same effect can be obtained.

While specific embodiments of the invention have been illustrated and described herein, it is realized that other modification and changes will occur to those skilled in the art. It is therefore to be understood that the appended claims are intended to cover all modifications and changes as fall within the true spirit and scope of the invention.

What we claim is:

1. A method for filling a contact hole with a metal comprising:
   forming a shallow impurity region of less than about 0.2 μm depth of a first conductive type in a silicon substrate of a second conductive type;
   forming an insulating layer on said silicon substrate;
   forming a contact hole on said shallow impurity region through said insulating layer;
   forming a conductive material on the entire surface of said contact hole and said insulating layer;
   forming a mask on the entire surface of said conductive material;
   removing said mask except for portions of the lower side surface and bottom surface located in said contact hole;
   selectively leaving said conductive material on the lower side surface and bottom surface portions of said contact hole by etching said conductive material using said mask;
   reacting a gas containing a metal with said conductive material by a reducing reaction so that said metal is selectively grown on said conductive material which suppresses the direct reaction between said gas with said shallow impurity region; and
   filling said contact hole with said metal whereby ohmic contact is formed between said metal and said shallow impurity region.

2. The method of claim 1, wherein the conductive material is W, Mo, $WSi_2$, $MoSi_2$, polysilicon, or amorphous silicon.

3. The method of claim 1, wherein the gas is $MoF_6$, $WF_6$, $W(CO)_6$, or $Mo(CO)_6$.

* * * * *